United States Patent [19]

Nyhus

[11] 4,193,048
[45] Mar. 11, 1980

[54] BALUN TRANSFORMER

[75] Inventor: Orville K. Nyhus, Melbourne, Fla.

[73] Assignee: Rockwell International Corporation, El Segundo, Calif.

[21] Appl. No.: 918,175

[22] Filed: Jun. 22, 1978

[51] Int. Cl.² .............................................. H01P 5/10
[52] U.S. Cl. ..................................... 333/26; 333/246; 455/326
[58] Field of Search ................... 333/25, 26, 238, 246, 333/247

[56] References Cited

U.S. PATENT DOCUMENTS 3,678,418   7/1972   Woodward ........................... 333/26

*Primary Examiner*—Paul L. Gensler
*Attorney, Agent, or Firm*—Richard A. Bachand; H. Fredrick Hamann

[57] ABSTRACT

A balun transformer of conductor material formed on a printed circuit board substrate is fabricated of a pair of conductor lengths, each having first and second ends. The conductors are located on opposite sides of the printed circuit board, each with its first end adjacent its second end. In the preferred embodiment this is achieved by forming the conductor in a circular, or doughnut, configuration with the ends adjacent but slightly spaced from each other. The first ends of the conductors are located opposite each other, i.e., with one of the conductors rotated slightly with respect to the other, to enable conductor means extending through the printed circuit board to interconnect the first conductor ends. With the conductors thereby formed, an unbalanced connection can be established between the first end of one of the conductors and a second end of the other conductor, while a balanced connection can be established between the second ends of the conductors.

4 Claims, 2 Drawing Figures

BALUN TRANSFORMER

BACKGROUND OF THE INVENTION

Balun transformers are transformers which transform a balanced electrical state to an unbalanced electrical state. Although balun transformers can be configured and analyzed in various ways, in the present application, the balun transformer is envisioned as being of transmission line form. Typical examples of the fabrication and analysis of balun transformers in transmission line can be found in *Proceedings of the IRE*, "Some Broad-band Transformers" by C. L. Ruthroff, August, 1959, pp. 1337, et seq.

In the present state of the electronics art, especially in applications where compact and sub-compact electronic circuitry is essential, circuits are formed on well known printed circuit boards. In fact, it has been recognized that balun transformers can be fabricated of the actual stripline or conductor material of a printed circuit board substrate. This recognition eliminates the need for a separate balun transformer component, which can be of great advantage in many applications.

One stripline balun is shown in U.S. Pat. No. 3,571,722. As shown in FIG. 1 of said patent, a first stripline of generally "U" shape is formed on one side of a printed circuit board substrate. On the opposite side of the substrate is a patterned ground plane including an isolation gap of generally rectangular shape located generally within the confines of the "U". In the embodiment illustrated, the length of the legs of the "U" total approximately one-half wavelength. At the frequencies of about 975-1220 MHz, for instance, such dimensions would result in each side being about an inch in length, so that the entire assembly would be about two inches square. This size is undesirably large for many printed circuit board applications, especially where space is at a premium.

Another example of a microstrip balun is shown in U.S. Pat. No. 3,652,941. This patent shows the use of microstrip baluns to connect an RF input and a local oscillator input, both in unbalanced states, to respective input terminals of a quad diode race in a balanced state. Although this patent teaches microstrip baluns, the resulting structure is unlike that of applicants' in that it requires an unduly large linear dimension to achieve its effective purpose.

BRIEF DESCRIPTION OF THE INVENTION

In light of the above, it is an object of the invention to provide a broad-band transmission line balun transformer formed on a printed circuit board substrate, which requires a minimum of space.

This and other objects, features and advantages of the invention will become apparent from the following detailed description when read in conjunction with the appended claims and accompanying drawing.

The invention, in its broad aspect, is a balun transformer of conductor material formed on a printed circuit board substrate. The balun transformer is fabricated of a pair of conductor lengths, each having first and second ends. The conductors are located on opposite sides of the printed circuit board, each with its first end adjacent its second end. In the preferred embodiment, this is achieved by forming the conductor in a circular, or doughnut, configuration with the ends adjacent but slightly spaced from each other. The first ends of the conductors are located opposite each other, i.e., with one of the conductors rotated slightly with respect to the other, to enable conductor means extending through the printed circuit board to interconnect the first conductor ends. With the conductors thereby formed, an unbalanced connection can be established between the first end of one of the conductors and a second end of the other conductor, while a balanced connection can be established between the second ends of the conductors.

BRIEF DESCRIPTION OF THE DRAWING

The invention is illustrated in the accompanying drawing wherein.

In the figures of the drawing, like reference numerals are used to designate like or corresponding parts or points.

DETAILED DESCRIPTION OF THE PREFERRED EMBODIMENTS

Figure 1:
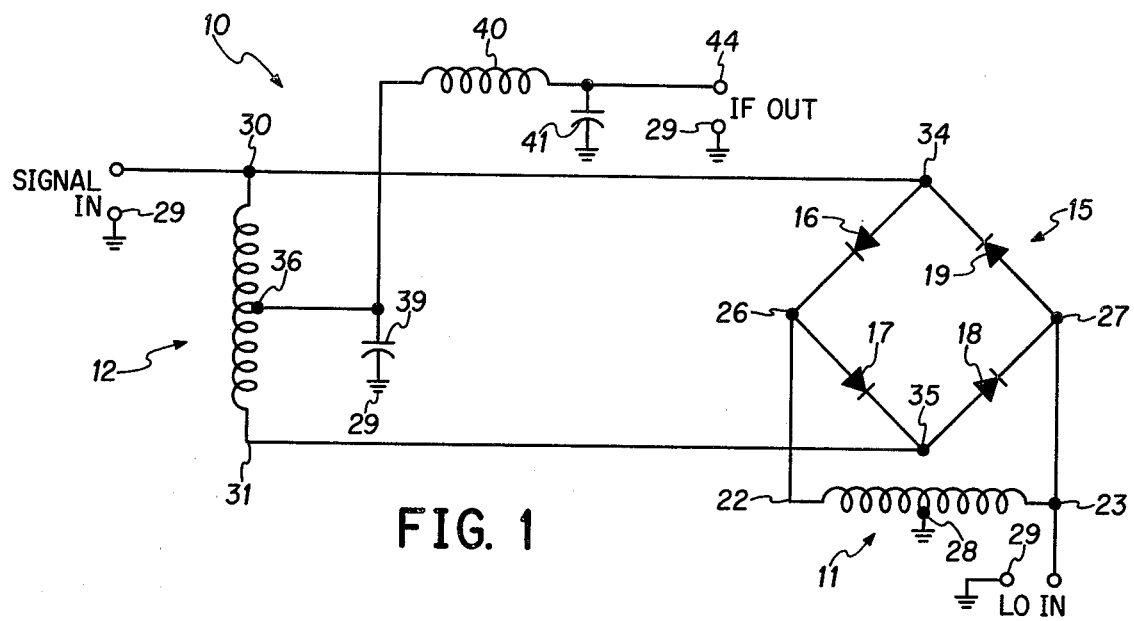
FIG. 1 is a schematic diagram of a double balanced mixer circuit using two balun transformers for which the baluns in accordance with the invention can be used.

Balun transformers, herein referred to simply as baluns, as mentioned above, are useful in converting an electrical signal carried on a pair of conductors from an unbalanced state to a balanced state. An unbalanced state is one in which one signal carrying conductor is referenced to ground, and a balanced state is one in which both conductors "float", neither being tied to ground. Two such baluns are employed in the double balanced mixer 10 of FIG. 1, and are designated generally by the reference numerals 11 and 12.

The double-balanced mixer circuit 10 of FIG. 1 employs a diode quad 15 having four diodes 16-19, the respective cathodes and anodes of which are connected to form a race, as shown. Such diode quads are well known in the art and are commercially available in a complete package, for example, such as a type DMD4006, presently made by Alpha Industries of Woburn, Mass.; or a type 5082—2830 made by Hewlett Packard of Palo Alto, California.

The balun coil 11 is connected at its ends 22 and 23 across a pair of respective opposite corners 26 and 27 of the diode quad 15. The center terminal 28 of the balun 11 is connected to ground. Thus, the local oscillator signal is connected in an unbalanced state between a ground connection 29 and one end 23 of the balun coil 11, to be applied in a balanced state to the opposite corners 26 and 27 of the diode quad 15.

In like fashion, the balun coil 12 is connected at its ends 30 and 31 across the remaining opposite corners 34 and 35 of the diode quad 15. The center terminal 36 of the balun 12 is connected by a capacitor 39 to ground 29. The RF signal input to this circuit is, therefore, connected in an unbalanced state between one end 30 of the balun coil 12 and ground 29, to be applied in a balanced state to the opposite corners 34 and 35 of diode quad 15. The intermediate frequency (IF) output is derived at the center tap 36 of the balun coil 12, and is filtered by an inductor 40 and capacitor 41 for delivery in an unbalanced state between terminal 44 and ground 29 for use.

Figure 2:
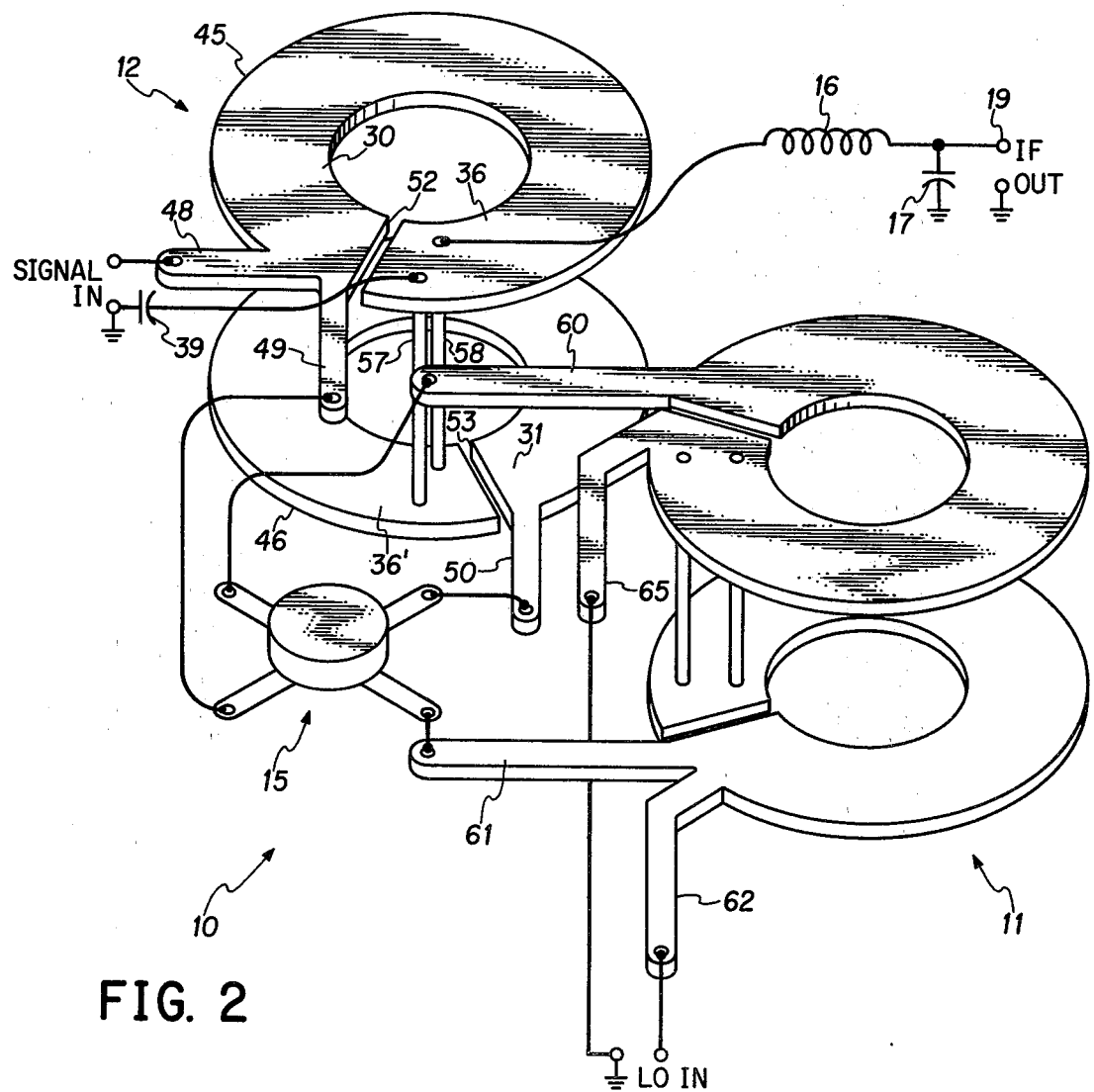
FIG. 2 is a perspective view, partially diagramatic, of a pair of baluns, each formed in accordance with the invention, as they would be formed on a printed circuit board substrate, but with the substrate removed to show the interrelationship therebetween and connected to form the double balanced mixer circuit of FIG. 1.

In accordance with the invention, the circuit of FIG. 1 can be fabricated on a printed circuit board substrate, and the balun coils 11 and 12 also can be formed or plated onto the substrate in accordance with well known printed circuit board techniques in the configuration shown in FIG. 2. In order to clearly illustrate the arrangement and relationship of the various parts of the baluns of the invention, the printed circuit board substrate material has been omitted from the drawing in FIG. 2.

Referring now particularly to the construction of the baluns, specifically with reference to the balun 12 in FIG. 2, it can be seen that the balun comprises two doughnut or circular shaped conductors 45 and 46, each disposed on a respective side of the printed circuit board (not shown). The halves 45 and 46 are axially aligned one over the other, as shown. Connections are made to one end 30 of the upper conductor 45 by tabs 48 and 49 outstanding from one of the corners thereof, in which, like the conductor 45 itself, can be formed as a part of the plating or conductor deposition process. In a similar fashion, connections are made to the lower conductor 46 by an outstanding tab 50.

As shown, the doughnut shape of the conductor 45 is interrupted by a gap 52 to thereby define the second and first ends 30 and 36, corresponding to connection points 30 and 36 of the coil 12 shown in FIG. 1. In a similar fashion, the doughnut shape of the conductor 46 is interrupted by a gap 53 to define the second and first ends 31 and 36', respectively again corresponding to connection points 31 and 36 of the coil 12 of FIG. 1. The gaps 52 and 53 are rotationally displaced from each other a slight amount whereby the first end 36 of the conductor 45 partially overlies the first end 36' of the conductor 46. In a preferred embodiment, this angle can be about 30°, but this is not deemed to be critical. The first end 36 of the conductor 45 is electrically connected to the first end 36' of the conductor 46 by plated-through holes 57 and 58, formed by well-known printed circuit board techniques for producing plated-through holes. Thus, electrically, the RF signal to be processed is conducted via tab 48 to the second end 30 of the conductor 45. The signal path then traverses around the conductor 45 to the first end 36, thence to the first end 36' of the conductor 46 via the plated-through hole conductors 57 and 58. The signal then travels around the conductor 46 to its second end 31 for removal from the balun via tab 50.

The other balun 11 is similarly fabricated and may be, as shown, rotationally displaced for ease of connection. The end connections to the balun 11 are made by tabs 60, 61 and 62. The center tap connection is made by tab 65.

The physical sizes and dimensions of the baluns are determined by the intended frequency of operation and the desired impedance at the operating point. The impedance is given approximately by the formula $Z_O \approx (120\pi)/\sqrt{\epsilon_r} (W/L)$ where $\epsilon_r$ is the dielectric constant of the material separating the two elements, W is the distance separating the two elements, L is the width of the stripe.

Thus, if the dimensions of the device were of L=0.1625 inches (the diameter of the circle being 0.45 inches and of the hole being 0.125 inches) the width of the printed circuit board 1/32nd of an inch and the dielectric constant is 4.7, the impedance of the balun would be approximately 33 ohms.

In addtion, with the conductor circle so fabricated, the frequency at which it can be efficiently used can be between, for instance, 978 and 1213 MHz. It should be appreciated that neither of the conductor elements 45 and 46 of the balun, fabricated in accordance with the invention, need be one-quarter wavelength in length. This recognition, together with the recognition that a characteristic impedance can be achieved, as above stated, enables the realization of the balun efficiently with printed circuit board techniques, as herein described. The precise dimensions needed to achieve any other particular purpose required of the balun can be easily determined from the formulas set forth in the above-referenced Ruthroff article.

Although the invention has been described and illustrated with a certain degree of particularity, it is understood that the present disclosure has been made only by way of example and that numerous changes and modifications can be made in the arrangement in combination of parts without departing from the spirit and scope of the invention as hereinafter claimed.

What is claimed is:

1. A balun transformer, comprising:
   a printed circuit board having top and bottom surfaces,
   a pair of similarly configured electrical conductors, each having first and second ends,
   each of said conductors being arranged with its first end adjacent its second end,
   said pair of conductors also being carried by and aligned on opposite sides of said printed circuit board with the first end of one conductor opposite the first end of the other conductor to facilitate interconnection thereof through said printed circuit board,
   and means extending through said printed circuit board electrically interconnecting the first ends of said conductors,
   said balun transformer providing an unbalanced condition between one of said first ends of said conductors and a second end of one of said conductors, and a balanced connection between the second ends of said conductors.

2. The balun transformer of claim 1 wherein said pair of electrical conductors are formed in a circular configuration.

3. The balun transformer of claim 2 wherein said conductors are etched copper strips.

4. The balun transformer of claim 3 wherein said means extending through said printed circuit board interconnecting the first ends of said conductors is a plated throughhole.

* * * * *